(12) United States Patent  (10) Patent No.: US 7,977,795 B2
Higashi et al.  (45) Date of Patent: Jul. 12, 2011

(54) SEMICONDUCTOR DEVICE, METHOD OF FABRICATING THE SAME, AND PATTERN GENERATING METHOD

(75) Inventors: Kazuyuki Higashi, Kanagawa (JP); Noriaki Matsunaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 931 days.

(21) Appl. No.: 11/619,338

(22) Filed: Jan. 3, 2007

(65) Prior Publication Data

US 2007/0158849 A1 Jul. 12, 2007

(30) Foreign Application Priority Data

Jan. 5, 2006 (JP) ................................. 2006-000929

(51) Int. Cl.
*H01L 23/48* (2006.01)
*H01L 23/52* (2006.01)
*H01L 29/40* (2006.01)

(52) U.S. Cl. ................................ 257/758; 257/E23.142

(58) Field of Classification Search .................. 257/758, 257/E23.142
See application file for complete search history.

(56) References Cited

U.S. PATENT DOCUMENTS

| 6,664,642 | B2 * | 12/2003 | Koubuchi et al. | 257/776 |
| 2003/0203619 | A1 * | 10/2003 | Abe | 438/637 |
| 2004/0083438 | A1 * | 4/2004 | Ohba et al. | 716/2 |
| 2005/0082577 | A1 | 4/2005 | Usui | |
| 2005/0133921 | A1 * | 6/2005 | Oki et al. | 257/758 |
| 2005/0247999 | A1 * | 11/2005 | Nishikawa et al. | 257/531 |
| 2005/0269702 | A1 * | 12/2005 | Otsuka | 257/750 |
| 2006/0006547 | A1 * | 1/2006 | Matsunaga | 257/774 |
| 2006/0022224 | A1 * | 2/2006 | Hiroi | 257/226 |
| 2006/0022787 | A1 * | 2/2006 | Brennan et al. | 336/200 |
| 2006/0244156 | A1 * | 11/2006 | Cheng et al. | 257/784 |
| 2006/0292711 | A1 * | 12/2006 | Su et al. | 438/14 |
| 2008/0079159 | A1 * | 4/2008 | Gupta et al. | 257/758 |

FOREIGN PATENT DOCUMENTS

| JP | 2003-045876 | 2/2003 |
| JP | 2003-051547 | 2/2003 |
| JP | 2004-296843 | 10/2004 |
| JP | 2004-297022 | 10/2004 |
| JP | 2005-229086 | 8/2005 |

OTHER PUBLICATIONS

U.S. Appl. No. 11/951,559, filed Dec. 6, 2007, Matsunaga, et al.
Office Action mailed Jan. 14, 2011, in Japanese Patent Application No. 2006-354769. filed Dec. 28, 2006, (with English language translation).

* cited by examiner

*Primary Examiner* — Kiesha R Bryant
*Assistant Examiner* — Igwe U Anya
(74) *Attorney, Agent, or Firm* — Oblon, Spivak, McClelland, Maier & Neustadt, L.L.P.

(57) ABSTRACT

A semiconductor device according to an embodiment of the present invention has: a semiconductor substrate; an interlayer insulating film formed above the semiconductor substrate; a protective film formed on the interlayer insulating film, the protective film having a higher density than that of the interlayer insulating film; at least one of a wiring and a dummy wiring formed in the interlayer insulating film and the protective film; and a separation wall formed within the interlayer insulating film so as to surround a low density region to separate the low density region from other regions, a sum of covering densities of the wiring and the dummy wiring being lower than a predetermined prescribed value in the low density region.

15 Claims, 9 Drawing Sheets

SEMICONDUCTOR DEVICE, METHOD OF FABRICATING THE SAME, AND PATTERN GENERATING METHOD

CROSS-REFERENCE TO RELATED APPLICATIONS

This application is based upon and claims the benefit of priority from prior Japanese Patent Application No. 2006-000929, filed on Jan. 5, 2006, the entire contents of which are incorporated herein by reference.

BACKGROUND OF THE INVENTION

The present invention relates to a semiconductor device, a method of fabricating the same, and a pattern generating method.

In recent years, an insulating material having a relative dielectric constant of 3 or less has been used in an interlayer insulating film of a semiconductor integrated circuit substrate. As a result, there has been caused a problem that a barrier metal for a copper wiring formed in an interlayer insulating film is corroded by a residual gas, such as $H_2O$, remaining in an insulating film, and thus the reliability of a semiconductor device is deteriorated. Normally, in the semiconductor fabricating process, before a process for forming a barrier metal is carried out, degassing processing is carried out for the residual gas. However, the degassing is carried out through a region in which a wiring trench is formed in the interlayer insulating film. Also, wiring inhibition regions formed upper and lower wiring layers, respectively, with respect to a wiring layer having an inductor formed therein so as to correspond in position to the inductor, a wiring inhibition region formed under a wiring layer having a pad portion for wire bonding formed therein so as to correspond in position to the pad portion for wire bonding, a redundancy region formed below a fuse, and the like exist in a semiconductor device having a multilayer interconnection formed therein. The coverage of a wiring pattern is extremely less in each of these regions, therefore many wiring trenches within the corresponding interlayer insulating film are not formed in such a region. Therefore, the degassing is not sufficiently performed from the interlayer insulating film through wiring trenches or via holes formed below the wiring trenches. As a result, there is encountered a problem that the residual gas remaining in this region corrodes the barrier metal of the wiring pattern to cause imperfect wiring conduction or imperfect via conduction, thereby deteriorating the reliability of the semiconductor device.

Now, a semiconductor device including moisture resistance rings is proposed as a conventional semiconductor device. In this semiconductor device, the multiple moisture resistance rings are formed, and are bridged at a plurality of height levels with conductor patterns extending along a chip periphery, thereby making it possible to block penetration of the moisture or gas from the outside. This conventional semiconductor device, for example, is disclosed in Japanese Patent KOKAI No. 2004-296843.

In addition, a semiconductor device in which in order to enhance a moisture resistance property by using seal rings surrounding a circuit formation portion, wiring trenches are formed in a plurality of interlayer insulating films, respectively, so as to surround the circuit formation portion along a periphery of a semiconductor chip, conductive layers made of copper or a material containing therein copper as a basic constituent are buried in the wiring trenches, respectively, through a first anti-diffusion film made of copper so as to be connected to each other, and a second anti-diffusion film made of copper is formed between a plurality of interlayer insulating films so as to be connected to the first anti-diffusion film made of copper is proposed as another conventional semiconductor device. This another conventional semiconductor device, for example, is disclosed in Japanese Patent KOKAI No. 2004-297022.

However, although in the conventional semiconductor devices disclosed in Japanese Patent KOKAI Nos. 2004-296843 and 2004-297022, respectively, the penetration of the moisture or gas from the outside of the semiconductor device can be blocked by the moisture resistance wings or the like, it is impossible to prevent the imperfect wiring conduction or the imperfect via conduction from being caused due to the residual gas generated inside the moisture resistance rings or the like.

BRIEF SUMMARY OF THE INVENTION

A semiconductor device according to one embodiment of the present invention comprises:
a semiconductor substrate;
an interlayer insulating film formed above the semiconductor substrate;
a protective film formed on the interlayer insulating film, the protective film having a higher density than that of the interlayer insulating film;
at least one of a wiring and a dummy wiring formed in the interlayer insulating film and the protective film; and
a separation wall formed within the interlayer insulating film so as to surround a low density region to separate the low density region from other regions, a sum of covering densities of the wiring and the dummy wiring being lower than a predetermined prescribed value in the low density region.

A method of fabricating a semiconductor device according to another embodiment of the present invention comprises:
forming an interlayer insulating film above a semiconductor substrate;
forming a protective film having a higher density than that of the interlayer insulating film on the interlayer insulating film; and
forming at least one of a wiring and a dummy wiring within a first trench where predetermined portions of the protective film and the interlayer insulating film are removed, respectively, and a separation wall within a second trench so as to surround a low density region, an open area ratio of the first trench within the interlayer insulating film being lower than a predetermined prescribed value in the low density region.

A method of generating a pattern for a semiconductor device according to still another embodiment of the present invention comprises:
generating at least one of a wiring and a dummy wiring in accordance with wiring layout data, the wiring and the dummy wiring being to be formed within an interlayer insulating film;
calculating a sum of covering densities of the wiring and the dummy wiring every predetermined region within the interlayer insulating film;
extracting a low density region, the sum of the covering densities of the wiring and the dummy wiring in the low density region being lower than a predetermined prescribed value; and
generating a metallic wall to be formed within the interlayer insulating film so as to surround at least one of the low density regions thus extracted.

DETAILED DESCRIPTION OF THE INVENTION

Figure 1:
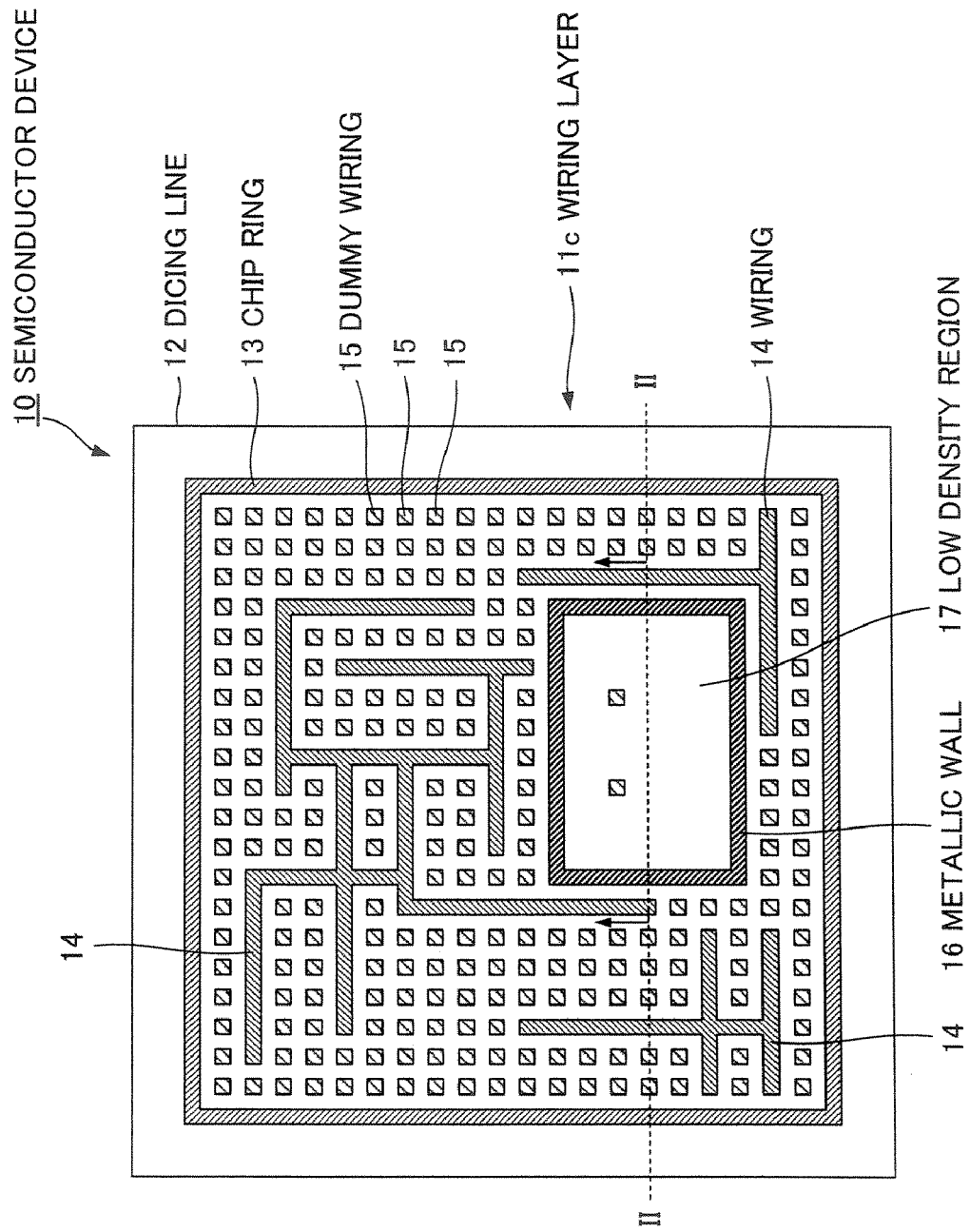
FIG. 1 is a plan view of a predetermined wiring layer which a semiconductor device according to a first embodiment of the present invention has.

FIG. 1 is a plan view of a predetermined wiring layer 11c which a semiconductor device 10 according to a first embodiment of the present invention has. The semiconductor device 10 has a semiconductor substrate (not shown) having a surface on which a semiconductor element is formed, and a plurality of wiring layers laminated on the semiconductor substrate. The wiring layer 11c of the plurality of wiring layers is shown in FIG. 1. In the wiring layer 11c, a chip ring 13 is formed inside a dicing line 12 for the purpose of suppressing occurrence of a crack or the like in a phase of dicing.

A wiring 14 is formed in predetermined pattern within a region surrounded by the chip ring 13. In addition, in order to unify a covering density of a wiring (a ratio of an area occupied by a wiring formed in a predetermined region to an area of the predetermined region), a dummy wiring 15 not belonging a circuit is formed. The reason for this is because when the covering density of the wiring is ununiform, there is the possibility that there are caused a problem that reactive ion etching (RIE) processing and chemical mechanical polishing (CMP) processing in the processing for fabricating the semiconductor device 10 are not uniformly carried out within a wiring layer, and a problem that the wiring layer is pealed off by the CMP processing.

On the other hand, when a member such as an inductor or a pad portion for wire bonding exist either in an upper layer overlying the wiring layer 11c or in a lower layer underlying the wiring layer 11c, in order to suppress an increase in electrical capacity or noises due to crosstalk or the like, a low density region 17 in which a sum of covering densities of the wiring and the dummy wiring 15 is lower than a predetermined prescribed value is provided in a region of the wiring layer 11c so as to correspond in position to such a member. The predetermined prescribed value, for example, is 20%. In addition, a metallic wall 16 surrounding the low density region 17 is formed so as to separate the low density region 17 from other regions (e.g., a region in which a sum of the covering densities of the wiring 14 and the dummy wiring 15 is not lower than 20%) within the wiring layer 11c.

Note that, the arrangements of the wiring 14, the dummy wiring 15 and the like are determined in accordance with a circuit design, a pattern layout design and the like by referring to a design information file in which design rules, wiring layout data or the like is preserved.

Figure 2:
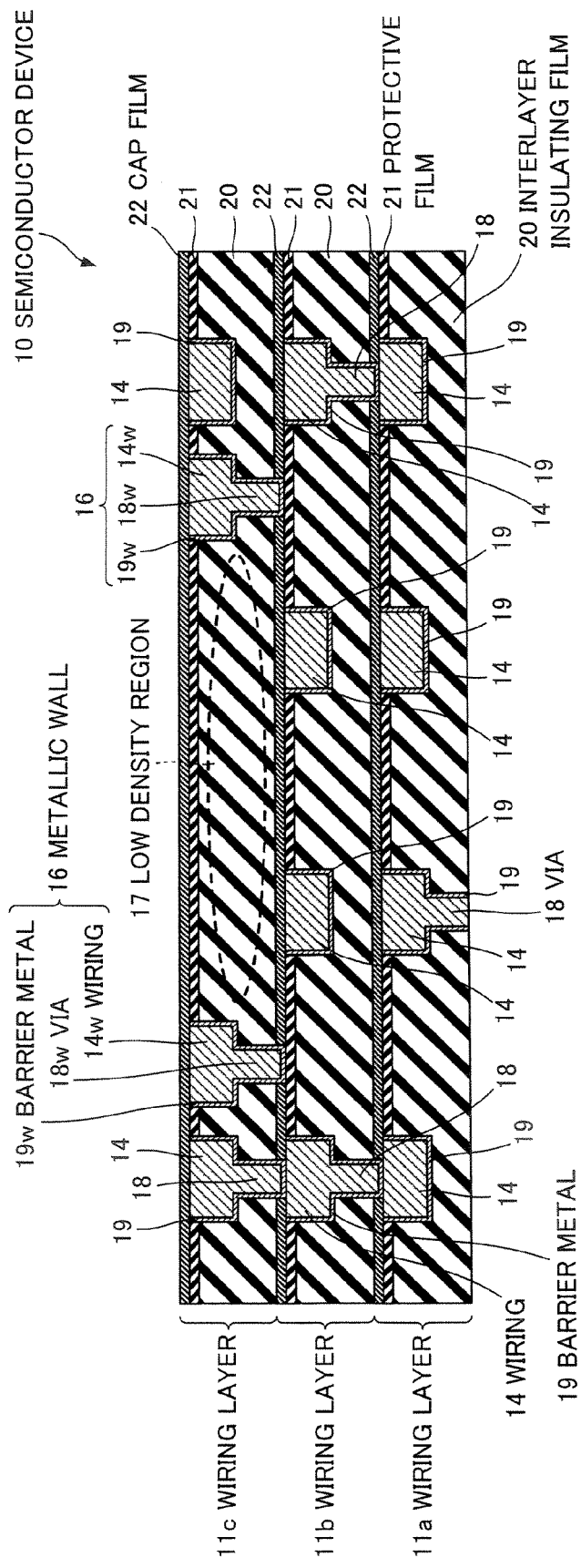
FIG. 2 is a cross sectional view of the semiconductor device according to the first embodiment of the present invention.

FIG. 2 is a cross sectional view of the semiconductor device 10 according to the first embodiment of the present invention. Also, FIG. 2 shows a cross section of wiring layers taken on a broken line II-II of FIG. 1. Here, although three layers consisting of wiring layers 11a, 11b and 11c are shown as an example in this embodiment, the number of wiring layers is not limited three.

The wiring layers 11a, 11b and 11c include interlayer insulating films 20 in each of which wirings 14, vias 18 and the like are formed. Surfaces of the wiring 14 and the via 18 are coated with a barrier metal 19 and a cap film 22 in order to prevent internal metals from diffusing into the interlayer insulating film 20. In addition, protective films 21 are formed as stoppers during the CMP processing or the like on the interlayer insulating films 20 of the wiring layers 11a, 11b and 11c, respectively. Note that, the illustration of the dummy wiring 15 is omitted in FIG. 2.

Figure 9:
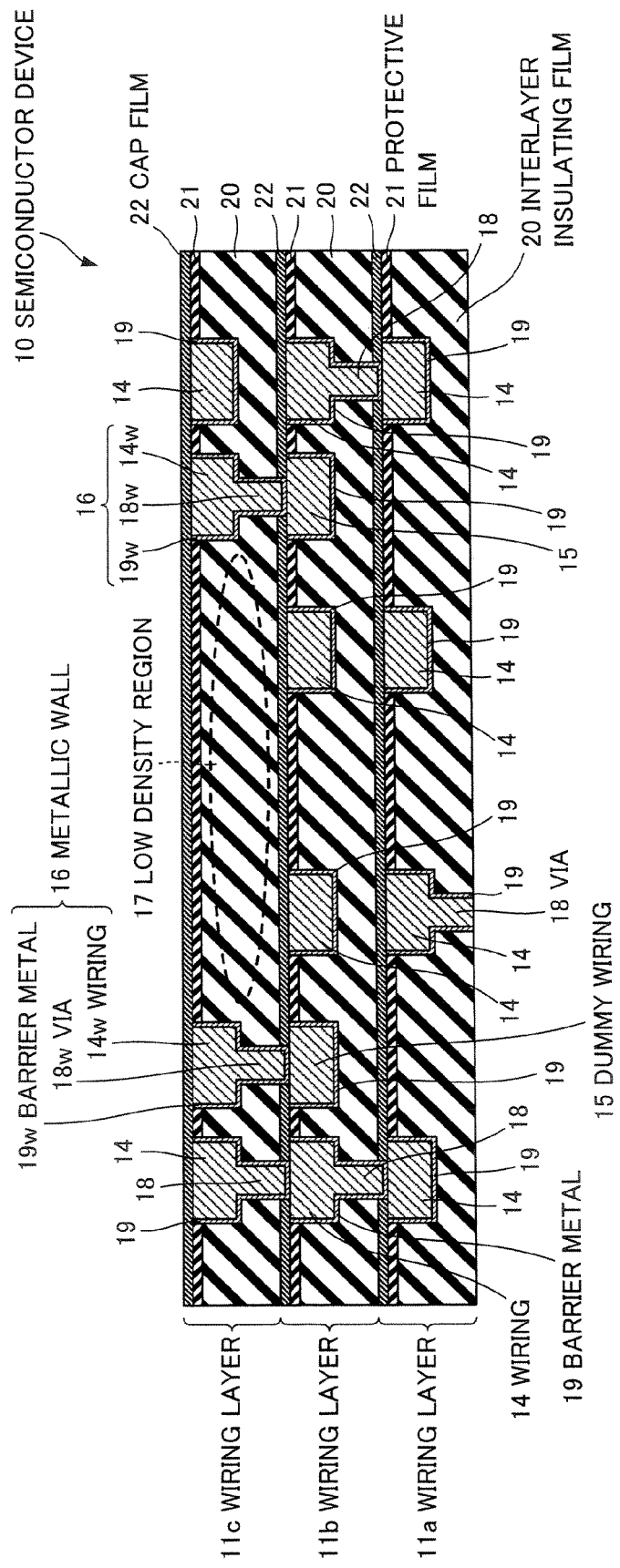
FIG. 9 is a cross sectional view of the semiconductor device according to the first embodiment of the present invention.

A metallic wall 16 including a wiring 14w, a via 18w and a barrier metal 19w is formed between the low density region 17 of the wiring layer 11c and the wiring 14 in the vicinity of the low density region 17. The metallic wall 16 is formed so as to surround the low density region 17, so that a lot of residual gas such as $H_2O$ contained in the low density region 17 is prevented from moving to the position of the wiring 14. Note that, the metallic wall 16, and the wirings 14 and the vias 18 within the upper and lower wiring layers with respect to the wiring layer having the metallic wall 16 formed therein are preferably formed in positions where they are not electrically connected to each other. On the other hand, as shown in FIG. 9, a dummy wiring 15 may be formed in the wiring layer 11b underlying the wiring layer 11c having the metallic wall 16 formed therein so as to be mutually connected to the metallic wall 16. As a result, when a trench in which the metallic wall 16 is intended to be formed is formed in the wiring layer 11c, the trench can be prevented from reaching the interlayer insulating film 20 of the wiring layer 11b because the dummy wiring 15 formed in the wiring layer 11b acts as a stopper. In addition, the metallic walls may also be formed in different two or more wiring layers. In this case, the metallic walls 16 within the upper and lower wiring layers may be or may not be connected to each other.

Here, an area, of the low density region 17 surrounded by the metallic wall 16, in a surface direction of the interlayer insulating film 20, for example, is not smaller than 400 $\mu m^2$. The reason for this is because when the area is smaller than 400 $\mu m^2$, an amount of residual gas remaining within the low density region 17 does not become a problem so much.

Here, the interlayer insulating film 20 is made of an insulating material, such as SiOC, methylsiloxane or polyarylene, having a relative dielectric constant of 3 or less. In addition, each of the wiring 14 and the dummy wiring 15 is made of Cu or the like. In addition, the protective film 21 is made of an insulating material, such as $SiO_2$, SiC, SiOC, SiON or SiCN, having a higher density (amass density per unit volume) than that of the interlayer insulating film 20. In addition, the cap layer 22 is made of an insulating material such as SiC or SiN. Also, the barrier metal 19 is made of Ta, TaN, Ti, TiN or WN, a lamination structure thereof, or the like. Also, the wiring 14w may be made of the same material as that of the wiring 14. Also, the via 18w may be made of the same material as that of the via 18. Moreover, the barrier metal 19w may be made of the same material as that of the barrier metal 19.

Figure 3A:
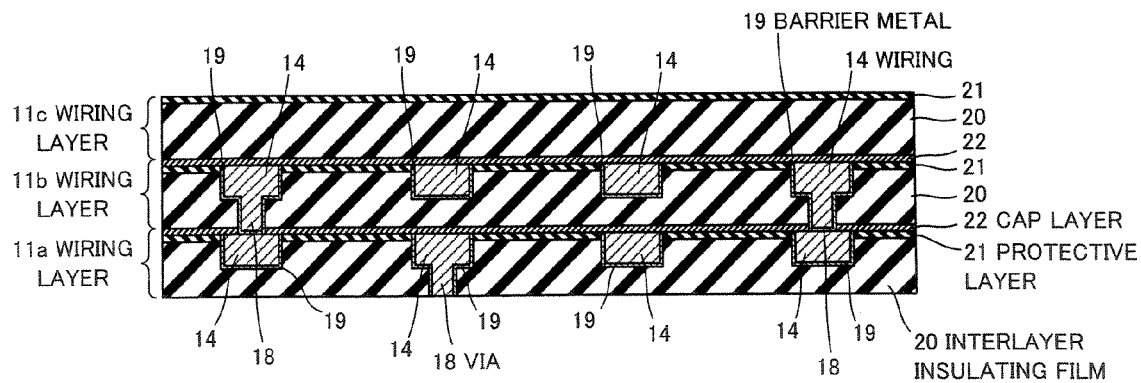
FIGS. 3A to 3C are respectively cross sectional views showing steps of fabricating the semiconductor device according to the first embodiment of the present invention.
Figure 3B:
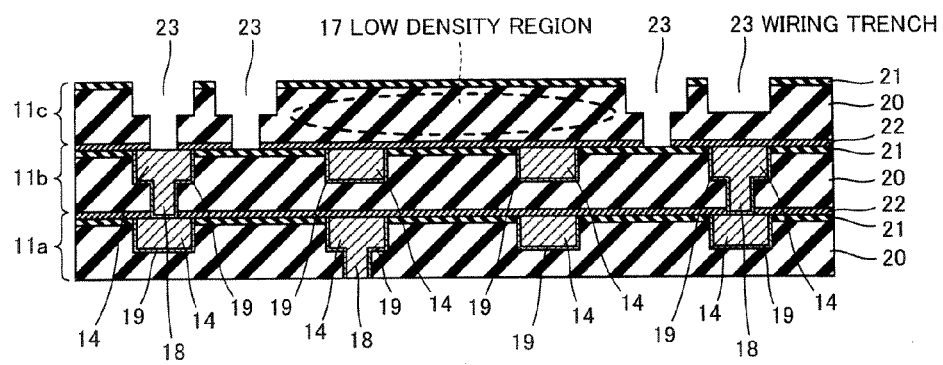
Figure 3C:
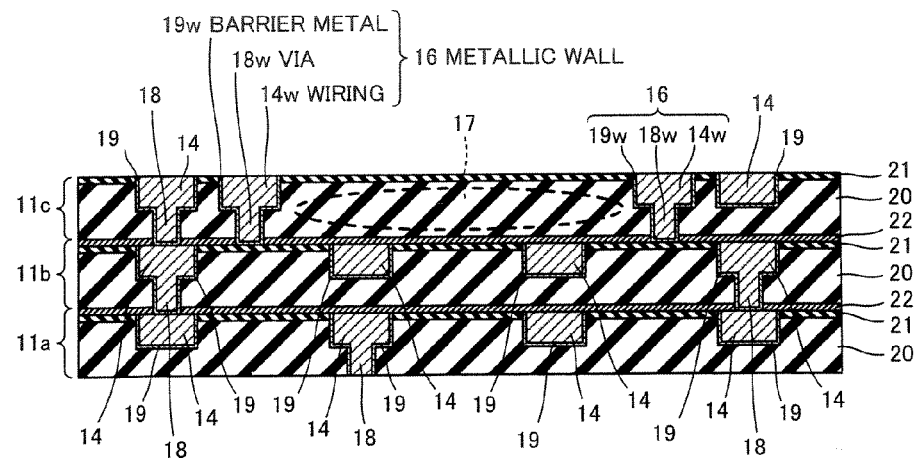

FIGS. 3A to 3C are respectively cross sectional views showing steps of fabricating the semiconductor device 10 according to the first embodiment of the present invention.

As shown in FIG. 3A, after the wiring layers 11a and 11b are formed, the interlayer insulating film 20 and the protective film 21 of the wiring layer 11c are formed on the wiring layer 11b. Although the interlayer insulating film 20 contains therein a residual gas such as $H_2O$, since the density of the protective film 21 formed on the surface of the interlayer insulating film 20 is high, even when the degassing processing by the heating is carried out, the residual gas cannot pass through the protective film 21, and thus is not discharged to the outside.

Next, as shown in FIG. 3B, wiring trenches 23 are formed in which the wirings 14 or the like are intended to be formed. Since the protective film 21 is removed in a portion in which the wiring trench 23 is formed, the residual gas remaining in the vicinities of the wiring trenches 23 within the interlayer insulating film 20 is discharged from the portion to the outside through the degassing processing carried out before a process for forming the barrier metal is carried out. However, in the region in which the number of wiring trenches formed is small as in the low density region 17 of the wiring layer 11c, the residual gas is not sufficiently discharged to the outside, and thus a lot of gas remains within the interlayer insulating film 20. It should be noted that the wiring trench 23 in which the wiring 14w and the via 18w are intended to be formed is formed so as to surround a region (a region which becomes the low density region 17) in which an open area ratio (a ratio of an area occupied by the wiring trench 23 formed within a predetermined region to an area of the predetermined region), within the interlayer insulating film 20, of the wiring trench 23 in which the wiring 14 and the via 18 are intended to be formed is lower than the predetermined prescribed value.

Next, after the degassing processing by the heating is carried out for the interlayer insulating film 20, as shown in FIG. 3C, the materials for the barrier metals 19 and 19w, the materials for the vias 18 and 18w, and the materials for the wirings 14 and 14w are deposited within the wiring trench 23, respectively. Then, the CMP processing is carried out by using the protective film 21 as a stopper, thereby forming the barrier metals 19 and 19w, the vias 18 and 18w and the wirings 14 and 14w in the wiring layer 11c. Note that, the wiring 14w, the via 18w and the barrier metal 19w constitute the metallic wall 16.

Subsequently, the cap film 22 is formed over the wirings 14 and 14w, and the protective film 21 of the wiring layer 11c. As a result, the semiconductor device 10 shown in FIG. 2 is composed.

Figure 4:
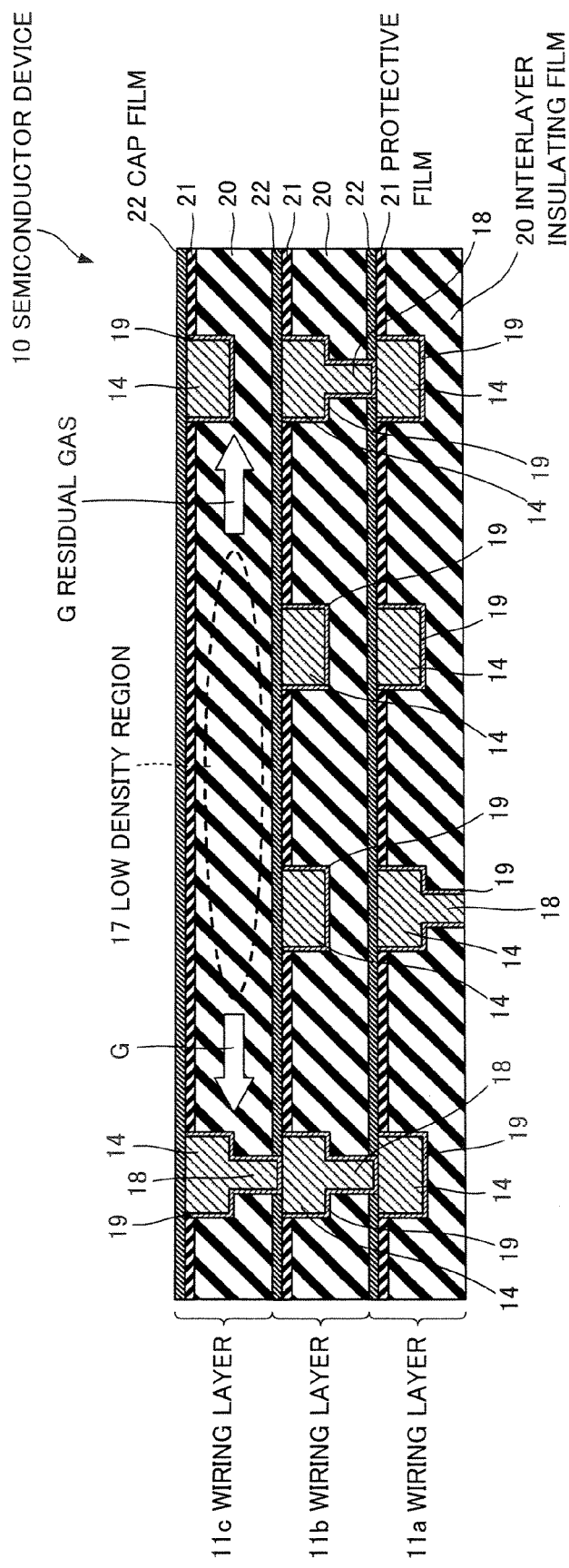
FIG. 4 is a cross sectional view of a semiconductor device as a reference example in which no metallic wall is formed.

FIG. 4 is a cross sectional view of a semiconductor device 10 as a reference example when no metallic wall 16 is formed. In this case, the residual gas G reaches the positions of the wiring 14 and the via 18 because there is no metallic wall 16 between each of the wiring 14 and the via 18, and the low density region 17 containing therein a lot of residual gas G in the wiring layer 11c. For this reason, for example, it is feared that the corrosion of the barrier metal 19 exerts a bad influence on the wiring 14 and the via 18. In particular, the possibility that the imperfect conduction is caused in the via 18 increases.

On the other hand, according to the first embodiment of the present invention, the formation of the metallic wall 16 between each of the wiring 14 and the via 18, and the low density region 17 prevents the residual gas G from reaching the positions of the wiring 14 and the via 18. As a result, the residual gas G can be prevented from exerting the bad influence on each of the wiring 14 and the via 18.

Here, the formation of the wiring 14 and the dummy wiring 15, and the formation of the metallic wall 16 can be performed in different processes. More specifically, a process for forming the wiring trench 23 in which the wiring 14 and the dummy wiring 15 are intended to be formed, depositing the metals as the materials for the wiring 14 and the dummy wiring 15, and forming the wiring 14 and the dummy wiring 15 by flattening the metals thus deposited, and a process for forming the wiring trench 23 in which the metallic wall 16 is intended to be formed, depositing the metal as the material for the metallic wall 16, and forming the metallic wall 16 by flattening the metal thus deposited are separately carried out. In this case, each of the wiring 14 and the dummy wiring 15, and the metallic wall 16 may be made of different materials, respectively. In addition, a separation wall can be used which is made of an insulating material or the like other than any of the metals instead of using the metallic wall 16 as long as it is a member which can become a barrier against the residual gas G remaining within the interlayer insulating film 20.

Figure 5:
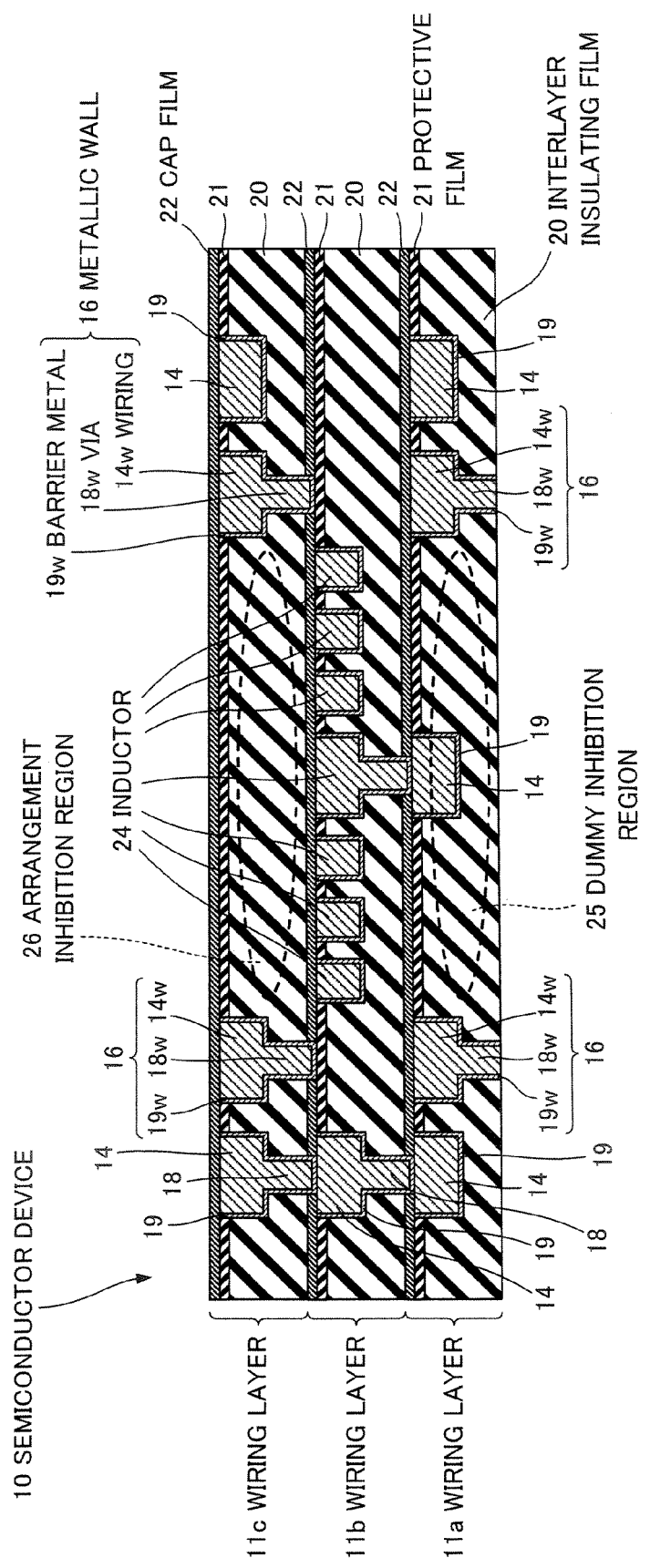
FIG. 5 is a cross sectional view of a semiconductor device according to a second embodiment of the present invention.

FIG. 5 is a cross sectional view of a semiconductor device 10 according to a second embodiment of the present invention. The second embodiment of the present invention is different from the first embodiment in that the metallic walls 16 are formed in the peripheries of a dummy inhibition region 25 and an arrangement inhibition region 26, respectively. Note that, a description of the same respects, relating to the materials and the structures of the portions, as those in the first embodiment is omitted here for the sake of simplicity.

As shown in FIG. 5, an inductor 24 having a coil-like shape is formed in the wiring layer 11b. The electrical capacity increases when conductive materials exist in upper and lower wiring layers, respectively, with respect to the wiring layer having the inductor 24 formed therein. For this reason, it is preferable that only the minimum necessary wirings 14 are formed in the upper and lower wiring layers with respect to the wiring layer 11b having the inductor formed therein and no dummy wiring 15 is formed.

The inductor 24 is formed in the wiring layer 11b and is connected to the wiring 14 within the wiring layer 11a formed right under the wiring layer 11b having the inductor 24 formed therein. For this reason, a region, of the wiring layer 11a, located right under the inductor 24 is preferably formed as the dummy inhibition region 25. The dummy inhibition region 25 is one, in which the installation of the dummy wiring 15 is inhibited, of the low density region 17. In this embodiment, no dummy wiring 15 is formed in the dummy inhibition region 25, and only the wiring 14 which is connected to the inductor 24 is formed in the dummy inhibition region 15.

In addition, a region, of the wiring layer 11c, located right above the inductor 24 is preferably formed as the arrangement inhibition region 26. The arrangement inhibition region 26 is one, in which the installations of both the wiring 14 and the dummy wiring 15 are inhibited, of the low density region 17.

The dummy inhibition region 25 and the arrangement inhibition region 26 has neither of the wiring 14 and the dummy wiring 15 or a small number of wirings 14 and dummy wirings 15 similarly to the low density region 17. Therefore, each of the dummy inhibition region 25 and the arrangement inhibition region 26 contains therein a lot of residual gas G.

The metallic walls 16 are formed between the dummy inhibition region 25 and the wiring 14 formed in the vicinity of the dummy inhibition region 25 in the wiring layer 11a, and between the arrangement inhibition region 26 and the wiring 14 formed in the vicinity of the arrangement inhibition region 26 in the wiring layer 11c, respectively. The metallic walls 16 are formed so as to surround the dummy inhibition region 25 and the arrangement inhibition region 26, respectively, and prevent a lot of residual gas G such as $H_2O$ contained in the dummy inhibition region 25 and the arrangement inhibition region 26 from moving to the positions of the respective wirings 14 and the respective vias 18.

According to the second embodiment of the present invention, the residual gas G contained in the arrangement inhibition region 26, in the wiring layer 11c, formed in the region right above the inductor 24, and the dummy inhibition region 25, in the wiring layer 11a, formed in the region right below the inductor 24 can be prevented from moving to the positions of the respective wirings 14 and the respective vias 18.

Note that, the positions where the arrangement inhibition region 26 and the dummy inhibition region 25 are formed, respectively, are not limited to those shown in the second embodiment.

In addition, an area of each of the dummy inhibition region 25 and the arrangement inhibition region 26, which are surrounded by the respective metallic walls 16, in a surface direction of the interlayer insulating film 20, for example, is not smaller than 400 $\mu m^2$. The reason for this is because when this area is smaller than 400 $\mu m^2$, an amount of residual gases remaining within the dummy inhibition region 25 and the arrangement inhibition region 26 do not become a problem so much.

Figure 6:
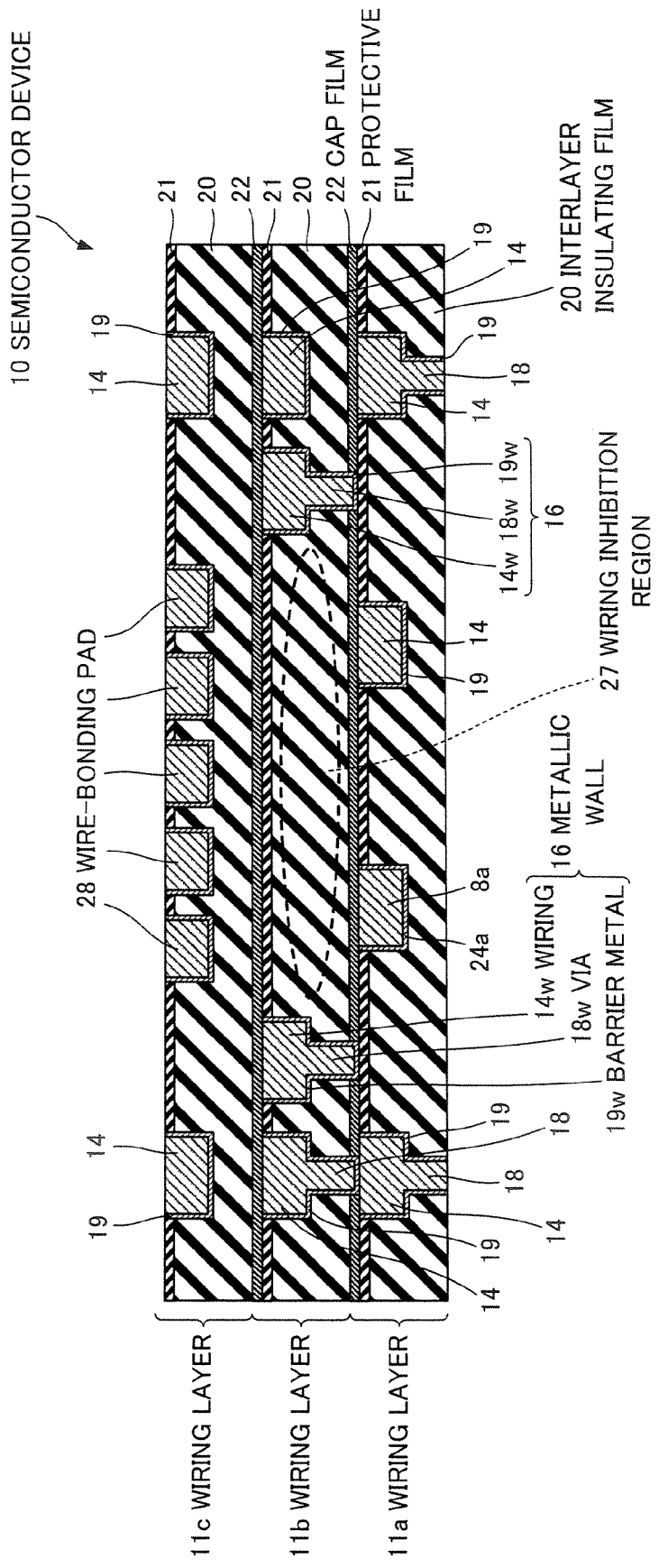
FIG. 6 is a cross sectional view of a semiconductor device according to a third embodiment of the present invention.

FIG. 6 is a cross sectional view of a semiconductor device 10 according to a third embodiment of the present invention. The third embodiment of the present invention is different from the first embodiment in that the metallic wall 16 is formed in the periphery of a wiring inhibition region 27. Note that, a description of the same respects, relating to the materials and the structures of the portions, as those in the first embodiment is omitted here for the sake of simplicity.

As shown in FIG. 6, wire-bonding pads 28 are formed in the wiring layer 11c. When the wiring 14 exists below the wire-bonding pads 28, it may be damaged by a pressure when a wire is bonded. Therefore, no wiring 14 is preferably formed in the wiring layer underlying the wiring layer having the wire-bonding pads 28 formed therein. Note that, since there is no problem even when the dummy wiring is damaged by the pressure, the dummy wiring may be formed in the wiring layer underlying the wiring layer having the wire-bonding pads 28 formed therein.

The wire-bonding pads 28 are formed in the wiring layer 11c. For this reason, a region, of the wiring layer 11b, located right under the wire-bonding pads 28 is preferably formed as the wiring inhibition region 27. The wiring inhibition region 27 is one, in which the installation of the wiring 14 is inhibited, of the low density region 17.

The wiring inhibition region 27 has no wiring 14 and dummy wiring 15 or a small number of wirings 14 and dummy wirings 15 similarly to the low density region 17. Therefore, the wiring inhibition region 27 contains therein a lot of residual gas G.

The metallic wall 16 is formed between the wiring inhibition region 27 and the wiring 14 formed in the vicinity of the wiring inhibition region 27 in the wiring layer 11b. The metallic wall 16 is formed so as to surround the wiring inhibition region 27 and prevents a lot of residual gas G such as $H_2O$ contained in the wiring inhibition region 27 from moving to the positions of the wiring 14 and the via 18.

According to the third embodiment of the present invention, the residual gas G remaining in the wiring inhibition region 27, in the wiring layer 11b, formed in the region right under the wire-bonding pads 28 can be prevented from moving to the positions of the wiring 14 and the via 18.

Note that, the position where the wiring inhibition region 27 is formed is not limited to the position shown in the third embodiment. In addition, an area of the wiring inhibition region 27, which is surrounded by the metallic wall 16, in a surface direction of the interlayer insulating film 20, for example, is not smaller than 400 $\mu m^2$. The reason for this is because when this area is smaller than 400 $\mu m^2$, an amount of residual gas remaining within the wiring inhibition region 27 does not become a problem so much.

Figure 7:
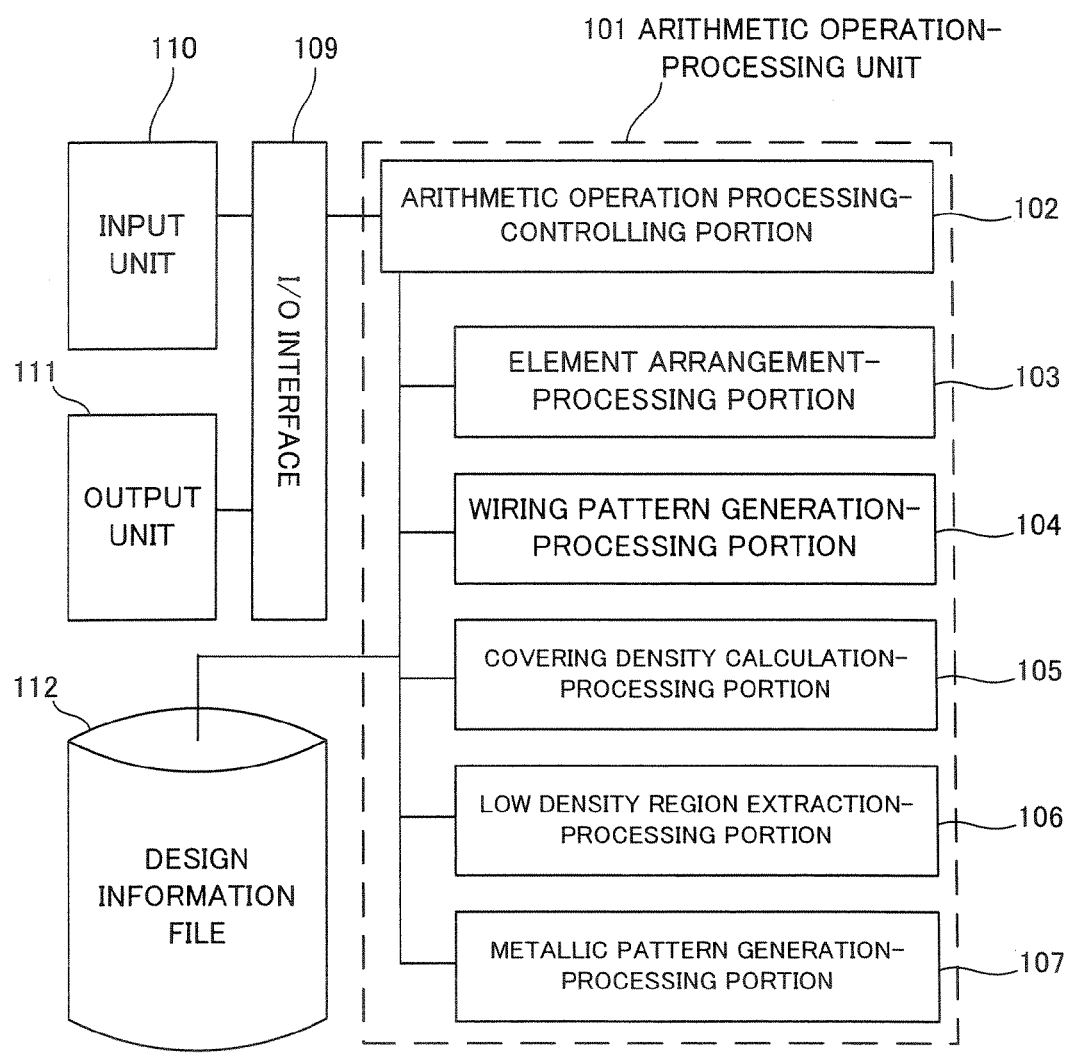
FIG. 7 shows a hardware configuration for realizing a method of generating a pattern for a semiconductor device according to a fourth embodiment of the present invention.

FIG. 7 shows a hardware configuration for realizing a method of generating a pattern for the semiconductor device 10 according to a fourth embodiment of the present invention. An apparatus for realizing the pattern generating method for the semiconductor device, for example, a computer aided design (CAD) apparatus includes an arithmetic operation-processing unit 101, an input unit 110 and an output unit 111 which input and output information to and from the arithmetic operation-processing unit 101, respectively, through an I/O interface 109, and a design information file 112 in which design rules, wiring layout data or the like on an arrangement of a semiconductor element, a wiring pattern, a wiring inhibition region and the like are preserved. The arithmetic operation-processing unit 101 has an element arrangement-processing portion 103, a wiring pattern generation-processing portion 104, a covering density calculation-processing portion 105, a low density region extraction-processing portion 106 and a metallic wall pattern generation-processing portion 107 which are controlled in accordance with a predetermined algorithm by an arithmetic operation processing-controlling portion 102.

Figure 8:
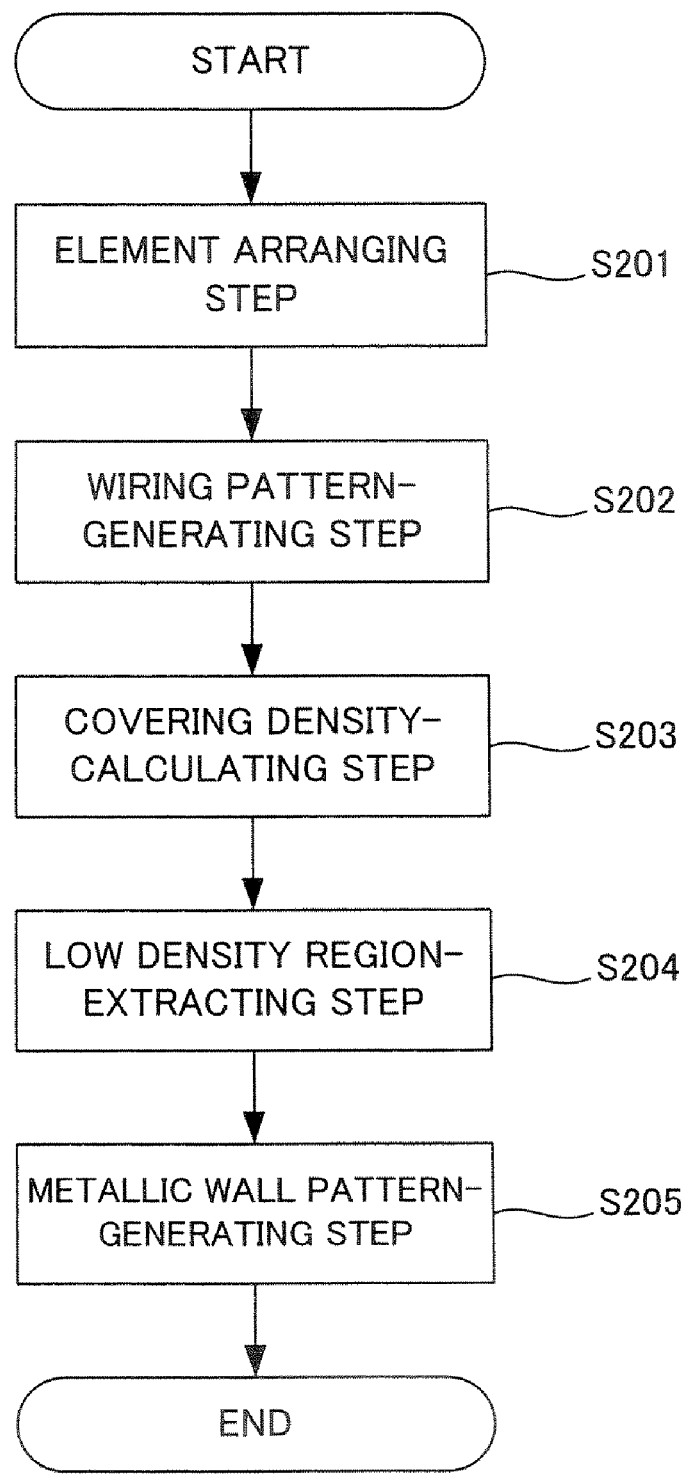
FIG. 8 is a flow chart showing the method of generating a pattern for a semiconductor device according to the fourth embodiment of the present invention.

FIG. 8 is a flow chart showing the pattern generating method for the semiconductor device 10 according to the fourth embodiment of the present invention. The pattern generating method for the semiconductor device 10 will now be described in accordance with the flow chart shown in FIG. 8.

When the arithmetic operation-processing unit 101 is given an instruction to carry out the pattern layout through the input unit 110, the arithmetic operation processing-controlling portion 102 reads out the arrangement information on the semiconductor element from the design information file 112. The element arrangement-processing portion 103 executes an element arranging step S201 of arranging the semiconductor element in predetermined layout on a semiconductor substrate in accordance with the arrangement information thus read.

Next, the arithmetic operation processing-controlling portion 102 reads out the wiring layout data from the design information file 112. The wiring pattern generation-processing portion 104 executes a wiring pattern-generating step S202 of generating a pattern for the wiring 14 and the dummy wiring 15 which are to be formed within the interlayer insulating film 20 above the semiconductor substrate in accordance with the wiring layout data thus read. The pattern for the wiring 14 and the dummy wiring 15 is generated so that when there is especially no limit, a sum of covering densities of the wiring 14 and the dummy wiring 15, for example, becomes 40% based on the arrangement of the semiconductor element.

Next, the covering density calculation-processing portion 105 executes a covering density-calculating step S203 of calculating a sum of covering densities of the wiring 14 and the dummy wiring 15 every predetermined region. The predetermined region, for example, is one having a size of 20 $\mu m \times 20$ $\mu m$. However, the size of the predetermined region can be changed in accordance with a substrate area, a line width of the wiring 14, the material for the interlayer insulating film 30, and the like.

Next, the low density region extension-processing portion 106 executes a low density region-extracting step S204 of extracting the low density region 17 in which a sum of the covering densities of the wiring 14 and the dummy wiring 15 which are calculated in the covering density-calculating step S203 is lower than a predetermined prescribed value. The predetermined prescribed value, for example, is 20%. However, the predetermined prescribed value can be changed in accordance with the substrate area, the line width of the wiring 14, the material for the interlayer insulating film 30, and the like.

Next, the metallic wall pattern generation-processing portion 107 executes a metallic wall pattern-generating step S205 of generating a pattern for the metallic wall 16 within the interlayer insulating film 20 so as to surround the low density region 17 which is extracted in the low density region-extracting step S204. In Step S205, when the low density regions 17 adjacent to each other are extracted, these adjacent low density regions 17 are grouped. Thus, the pattern for the metallic wall 16 can be generated so as to surround a region, which belongs to the grouped low density regions 17, having an area which is larger than a prescribed area, for example, an area of 20 μm×20 μm. The area described above can be changed in accordance with the substrate area, the line width of the wiring 14, the material for the interlayer insulating film 30, and the like.

According to the method of generating a pattern for the semiconductor device 10 according to the fourth embodiment of the present invention, it is possible to extract the low density region 17 in which the sum of the covering densities of the wiring 14 and the dummy wiring 15 is lower than the predetermined prescribed value. Thus, the pattern layout for the semiconductor device 10 can be designed in accordance with the low density region 17 thus extracted. As a result, the metallic wall 16 can be formed in such a position as to allow the residual gas G remaining within the low density region to be prevented from moving to the positions of the wiring 14 and the via 18. Therefore, the imperfect conduction of the wiring 14 and the via 18 or the like can be prevented from being caused, which makes it possible to enhance the operation reliability of the semiconductor device 10.

Here, of the low density region 17, the dummy inhibition region 25, the arrangement inhibition region 26, and the wiring inhibition region 27 can be individually extracted and the metallic wall 16 can be formed so as to surround these regions 25, 26 and 27. The low density region extraction-processing portion 106 can extract the dummy inhibition region 25 by searching for a region in which no dummy wiring 15 is formed in the wiring pattern-generating step S202. In addition, the low density region extraction-processing portion 106 can extract the arrangement inhibition region 28 by searching for a region which neither of the wiring 14 and the dummy wiring 15 is formed in the wiring pattern-generating step S202. Also, the low density region extraction-processing portion 106 can extract the wiring inhibition region 28 by searching for a region in which no wiring 14 is formed in the wiring pattern-generating step S202.

It should be noted that each of the first to fourth embodiments of the present invention is merely an embodiment, the present invention is not intended to be limited thereto, and the various changes thereof can be implemented without departing from the gist of the invention.

For example, when a redundancy circuit having a fuse wiring is formed in the semiconductor device 10, a lower layer underlying a portion in which the fuse wiring is intended to be cut is formed as the wiring inhibition region 28. The reason for this is because since when the fuse wiring is cut by using a laser beam, a region located below the portion in which the fuse wiring is cut also receives the radiation of the laser beam, there is the possibility that when the wiring 14 exists therein, it is damaged. Also, the metallic wall 16 can be formed so as to surround the wiring inhibition region 28.

It should be noted that the constituent elements of each of the first to fourth embodiments of the present invention can be arbitrarily combined with each other without departing from the gist of the invention.

What is claimed is:

1. A semiconductor device, comprising:
   a semiconductor substrate;
   an interlayer insulating film formed on the semiconductor substrate;
   a protective film formed on the interlayer insulating film, the protective film having a higher density than that of the interlayer insulating film;
   at least one of a wiring and a dummy wiring formed in the interlayer insulating film and the protective film;
   a chip ring formed in the interlayer insulating film that surrounds the at least one of the wiring and the dummy wiring; and
   a wall formed in the interlayer insulating film so as to be entirely surrounded by the chip ring and that entirely surrounds a first region, a second region being entirely surrounded by the chip ring and not surrounded by the wall, the wall formed at a position such that a first sum of covering densities of the at least one of the wiring and the dummy wiring in the first region is less than a second sum of covering densities of the at least one of the wiring and the dummy wiring in the second region.

2. A semiconductor device according to claim 1, wherein the sum of the covering densities of the at least one of the wiring and the dummy wiring in the first region is not more than 20% of a total area of the first region.

3. A semiconductor device according to claim 1, wherein the first region includes a wiring inhibition region in which an arrangement of the wiring is inhibited.

4. A semiconductor device according to claim 3, wherein the wiring inhibition region is formed at least right under a bonding pad formed in an a second layer of interlayer insulating film overlying the interlayer insulating film.

5. A semiconductor device according to claim 3, wherein the wiring inhibition region is formed at least right under a a fuse wiring formed in a second layer of interlayer insulating film overlying the interlayer insulating film.

6. A semiconductor device according to claim 1, wherein the first region includes a dummy inhibition region in which an arrangement of the dummy wiring is inhibited.

7. A semiconductor device according to claim 6, wherein the dummy inhibition region is formed at least either right under or right above an inductor formed in a second layer of interlayer insulating film either overlying or underlying the interlayer insulating film.

8. A semiconductor device according to claim 1, wherein the first region includes an arrangement inhibition region in which arrangements of the wiring and the dummy wiring are inhibited.

9. A semiconductor device according to claim 1, wherein the first region includes a surface area of at least 400 μm$^2$ of the interlayer insulating film.

10. A semiconductor device according to claim 1, wherein the wiring has a barrier metal on a surface facing the interlayer insulating film.

11. A semiconductor device according to claim 1, wherein the interlayer insulating film has a relative dielectric constant of 3 or less.

12. A semiconductor device according to claim 1, wherein the interlayer insulating film contains at least one of SiOC, methylsiloxane, and polyarylene.

13. A semiconductor device according to claim 1, wherein the protective film contains at least one of $SiO_2$, SiC, SiOC, SiON and SiCN.

14. A semiconductor device according to claim 1, wherein the wall is a metallic wall having a same structure as that of the wiring and a via connected to the wiring.

15. A semiconductor device according to claim 1, wherein the interlayer insulating film comprises a plurality of layers of interlayer insulating film and the wall is formed in only one of the plurality of layers of interlayer insulating film.

* * * * *